United States Patent

Ma et al.

[11] Patent Number: 5,956,473
[45] Date of Patent: Sep. 21, 1999

[54] METHOD AND SYSTEM FOR MANAGING A FLASH MEMORY MASS STORAGE SYSTEM

[75] Inventors: Chung-Wen Ma; Chun-Hung Lin; Tai-Yao Lee; Li-Jen Lee, all of HsinChu; Ju-Xu Lee, BingDong, all of Taiwan; Ting-Chung Hu, Milpitas, Calif.

[73] Assignee: Macronix International Co., Ltd., Hsinchu, Taiwan

[21] Appl. No.: 08/755,194

[22] Filed: Nov. 25, 1996

[51] Int. Cl.⁶ .................................................... G11C 13/00
[52] U.S. Cl. ............................... 395/182.03; 365/185.33; 365/189.01
[58] Field of Search ..................................... 395/180, 181, 395/182.03, 182.04, 182.05, 182.06, 185.06, 185.07; 365/189.01, 185.33

[56] References Cited

U.S. PATENT DOCUMENTS

| | | | |
|---|---|---|---|
| 4,768,169 | 8/1988 | Perlegos | 365/200 |
| 5,200,959 | 4/1993 | Gross et al. | 371/21.6 |
| 5,222,109 | 6/1993 | Pricer | 377/24.1 |
| 5,270,979 | 12/1993 | Harari et al. | 365/218 |
| 5,278,838 | 1/1994 | Ng et al. | 371/10.1 |
| 5,297,148 | 3/1994 | Harari et al. | 371/10.2 |
| 5,341,339 | 8/1994 | Wells | 365/218 |
| 5,388,083 | 2/1995 | Assar et al. | 365/218 |
| 5,396,468 | 3/1995 | Harari et al. | 365/218 |
| 5,400,389 | 3/1995 | Niiyama et al. | 379/58 |
| 5,406,529 | 4/1995 | Asano | 365/230.03 |
| 5,438,573 | 8/1995 | Mangan et al. | 371/2.1 |
| 5,448,577 | 9/1995 | Wells et al. | 371/40.1 |
| 5,459,850 | 10/1995 | Clay et al. | 395/497.02 |
| 5,471,478 | 11/1995 | Mangan et al. | 365/200 |
| 5,473,753 | 12/1995 | Wells et al. | 395/182.03 |
| 5,473,765 | 12/1995 | Gibbons et al. | 395/500 |
| 5,485,595 | 1/1996 | Assar et al. | 395/430 |
| 5,530,827 | 6/1996 | Matsui et al. | 395/430 |
| 5,535,369 | 7/1996 | Wells et al. | 395/497.02 |
| 5,544,356 | 8/1996 | Robinson et al. | 395/600 |
| 5,546,402 | 8/1996 | Niijima et al. | 371/40.4 |

*Primary Examiner*—Albert Decady
*Attorney, Agent, or Firm*—Mark A. Haynes; Wilson, Sonsini Goodrich & Rosati

[57] ABSTRACT

The present application discloses methods to provide defect management, wear leveling and data security to a mass storage system implemented using flash memory. The flash memory is organized into a plurality of blocks. Each block has a special region for storing its attributes. In defect management, defects arising from manufacturing and on-the-fly defects are scanned. Defective blocks are marked by altering its attributes. The present application also discloses a wear leveling method in which the difference between the number of erasures of any two blocks (except the defective blocks) is within a predetermined value. The present application further discloses a new error detection and correction method. The same data is stored in two separate memory locations. The content of these two locations are later "ored" or "anded" together (depending on the nature of error giving rise to the error) to recover the correct data.

13 Claims, 8 Drawing Sheets

METHOD AND SYSTEM FOR MANAGING A FLASH MEMORY MASS STORAGE SYSTEM

The present application is related to Application Ser. No. 08/756,304, filed: Nov. 25, 1996, and entitled: Flash Memory Mass Storage System, invented by: Chung-Wen Ma, Chun-Hung Lin, Tai-Yao Lee, Li-Jen Lee, Ju-Xu Lee and Ting-Chung Hu, now U.S. Pat. No. 5,745,418, issued: Apr. 28, 1998.

FIELD OF THE INVENTION

This invention relates to the field of mass storage for computers. More particularly, this invention relates to methods and systems for efficiently managing a flash memory system, including defect management, wear leveling and data security.

BACKGROUND OF THE INVENTION

Modern information processing systems make extensive use of nonvolatile random access memory devices as mass storage for storing programs and data. The most widely used nonvolatile memory device is hard disks, which are electro-mechanical devices that store data on magnetic material. Recently, semiconductor nonvolatile memory has been developed. One type of semiconductor nonvolatile memory is flash memory which is comprised of a large plurality of floating gate metal oxide silicon field effect transistors arranged as memory cells in typical row and column array. The floating gate design allows information to be retained after power is removed. Flash memory has a number of characteristics which adapt it to be used as mass storage in information processing systems: it is light in weight, occupies very little space, and consumes less power than electro-mechanical devices. Further, it is rugged, and can withstand repeated drops that could destroy electromechanical devices.

Flash memory typically contains a plurality of single transistor memory cells which are programmable through hot electron injection and erasable through Fowler-Nordheim tunneling. The programming and erasing of such a memory cell require current to pass through the dielectric surrounding a floating gate electrode. It is found that the dielectric will fail after a certain number of programming and erasing. Because of this property, such types of memory have a finite number of erase-write cycles. Manufacturers of flash cell devices specify the limit for the number erase-write cycles as between 10,000 and 100,000. This is different from other types of memory devices, such as rotating magnetic media (e.g., hard disk) and volatile memory chips (such as dynamic random access memory and static random access memory), which can go through millions of erase-write cycles before failure. As a result, it is desirable to reduce the number of erase-write cycle in flash memory.

Flash memory is typically erased by applying a high voltage to the source terminals of the cells in the memory. Because these source terminals are all connected to one another by metallic busing, the entire memory (or some subportions thereof) needs to be erased at the same time. Thus, in an erase operation, valid data along with invalid (dirty) data are erased. This is different from other random access memory devices in which individual bits can be erased and written.

Another difference between flash memory and other types of memory devices is that erase cycles in a flash memory device is slow (when compared to the read-write time of other types of memory devices). This property can significantly reduce the performance of a system utilizing flash memory as its mass storage, unless this system is specially design to compensate for the slow erase cycle.

It can be seen from the above that a new memory architecture and new method of managing the same need to be designed so as to effectively use flash memory as mass storage devices.

SUMMARY OF THE INVENTION

The present invention relates to a new architecture of a flash memory system and methods for managing common problems in a flash memory system. It is known that some of the cells in a flash memory may be defective upon production. Because of the need to reduce cost, the partially defective flash memory is not discarded if the number of defective cells are small. Instead, the present invention discloses a method to skip over these defective cells while the good cells are used to store data.

It is also known that the life of memory cells of a flash memory is relatively short (compared to DRAM and SRAM). Thus, some of the memory cells may become defective during use. Unless preventive method is invoked, the occurrence of defects in a small number of cells could render the entire memory system inoperative. The present invention discloses a mechanism for detecting defects dynamically and preserving data already stored in the memory system. As a result, the memory system of the present invention can continue to operate even when some of the cells fail while in use.

Another consequence of the relative short life of memory cells is that it is important to equalize the amount of use of each cell. Otherwise, some of the cells may become defective in a relatively short time. These defective cells have the effect of reducing the number of available memory, thereby adversely affecting the performance of the system. The present invention relates to a new wear leveling method that tends to equalize the number of erasure of blocks in the system. As a result, the available memory remains large throughout the useful life of the flash memory system.

It is desirable to ensure that data stored in a flash memory system be reliable. The present invention discloses a method that marks existing data invalid only after new and valid data has been correctly written. As a result, the security of the data can be guaranteed.

The present invention also involves a new error detection and correction method. It makes use of a common characteristics of flash memory that most error tends to change a bit from a know first state to a known second state.

These and other features of the present invention will become apparent from the following description when read in conjunction with the accompanying drawings.

DETAIL DESCRIPTION OF THE INVENTION

The present invention comprises a novel memory architecture and related methods. The following description is presented to enable any person skilled in the art to make and use the invention. Descriptions of specific applications are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

An essential function of a memory system is to store data. Further, software applications should be able to read from and write to the memory system. Flash memory has many characteristics which are different from conventional memory. Consequently, the architecture of a flash memory system needs to be organized to overcome any difficulty and make use of any advantageous features. One difference is that existing data in flash memory cannot be directly overwritten with new data. The flash memory needs to be erased first so that it becomes "clean" memory. New data can then be written into the clean memory. In contrast, data in dynamic random access memory (DRA), static random access memory (SRAM) and hard disk can be directly overwritten. This is one of the reasons the architecture of a flash memory system is different from conventional memory system.

Because each block can be erased only a relatively small number of times (compared to conventional memory) before becoming unusable, there is a need to reduce unnecessary erasure cycles.

In addition to the need to overcome the above described technical problems associated with flash memory, the performance of the system must be high and the cost low. Otherwise, it is not possible for a flash memory system to compete in the market place. One of the consequences of this requirement is that the architecture should not contain too much overhead. Thus, the hardware and software support (e.g., buffers, program code, etc.) need to be low, the data structure and algorithms need to be simple, and reliability and performance need to be high. The flash memory system of the present invention is designed to meet these requirements.

(A) Description of the System Architecture

(1) Dividing Memory Cells into Blocks

Figure 1A:
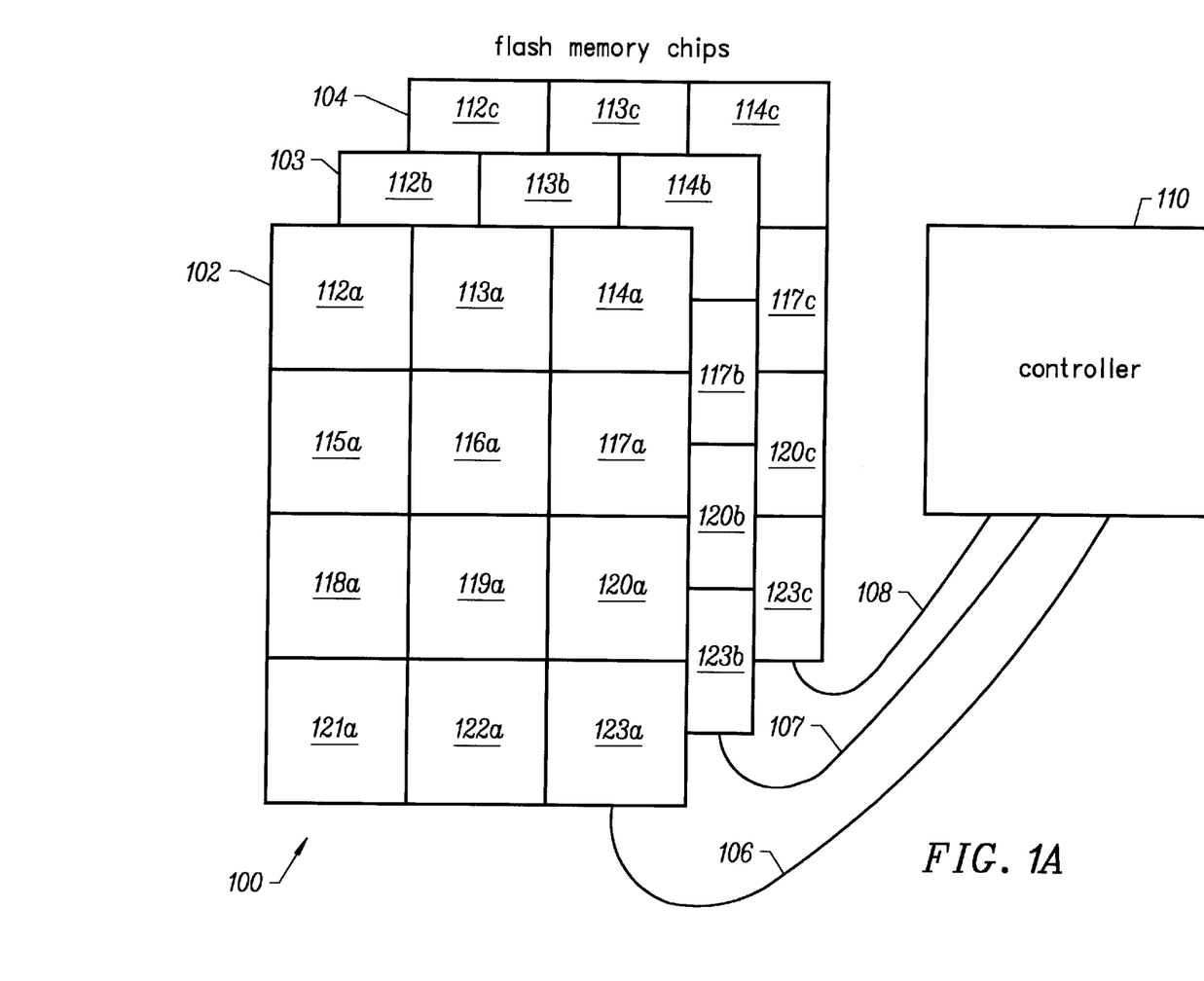
FIG. 1A is a schematic diagram of a flash memory system of the present invention.

FIG. 1A is a schematic drawing of a flash memory system 100 of the present invention. System 100 contains one or more flash memory chips for storing data and program, such as chips 102–104. These chips are electrically connected to a controller 110 via lines 106–108. In an embodiment of the present invention, these lines could be part of a bus for communicating digital data. Controller 110 performs a variety of functions (to be described in detail below), such as organizing flash memory chips 102–104 into memory blocks, allocating these memory blocks for different purposes, interface with devices external to system 100, etc. Controller 110 could be a dedicated data processing device. Alternatively, the functions of controller 110 could be performed by a general purpose microcomputer system consisting a central processing unit (CPU), random access memory (RAM), read-only memory (ROM), and a hard disk. In one application of the present invention, flash memory system 100 emulates the function and operation of a hard disk. In this application, the microcomputer system treats system 100 as a generic hard disk. Alternatively, flash memory system 100 could have an organization optimized for use in specialized systems, such as video game cartridges and industrial control data loggers.

Each memory chip may be divided into several memory blocks. Each memory block contains a large number of erasable programmable read-only memory cells that can store bits of data. For example, chip 102 is divided into blocks 112a–123b. Similarly, chips 103 and 104 are divided into blocks 112b–123b and 112c–123c, respectively. In a preferred embodiment, each of chips 102–104 is divided into the same number of blocks. However, it should be noted that the chips may have different number of blocks.

(2) Logical Organization of the Physical Blocks

The blocks in chips 102–104 must be logically organized so that they can provide a flexible system for storing data. One method of organization is to provide means for mapping physical blocks into logical structure. In the present invention, a special buffer is used for this mapping. By changing the content in this buffer, the same physical block can be mapped into different logical organizations.

Figure 1B:
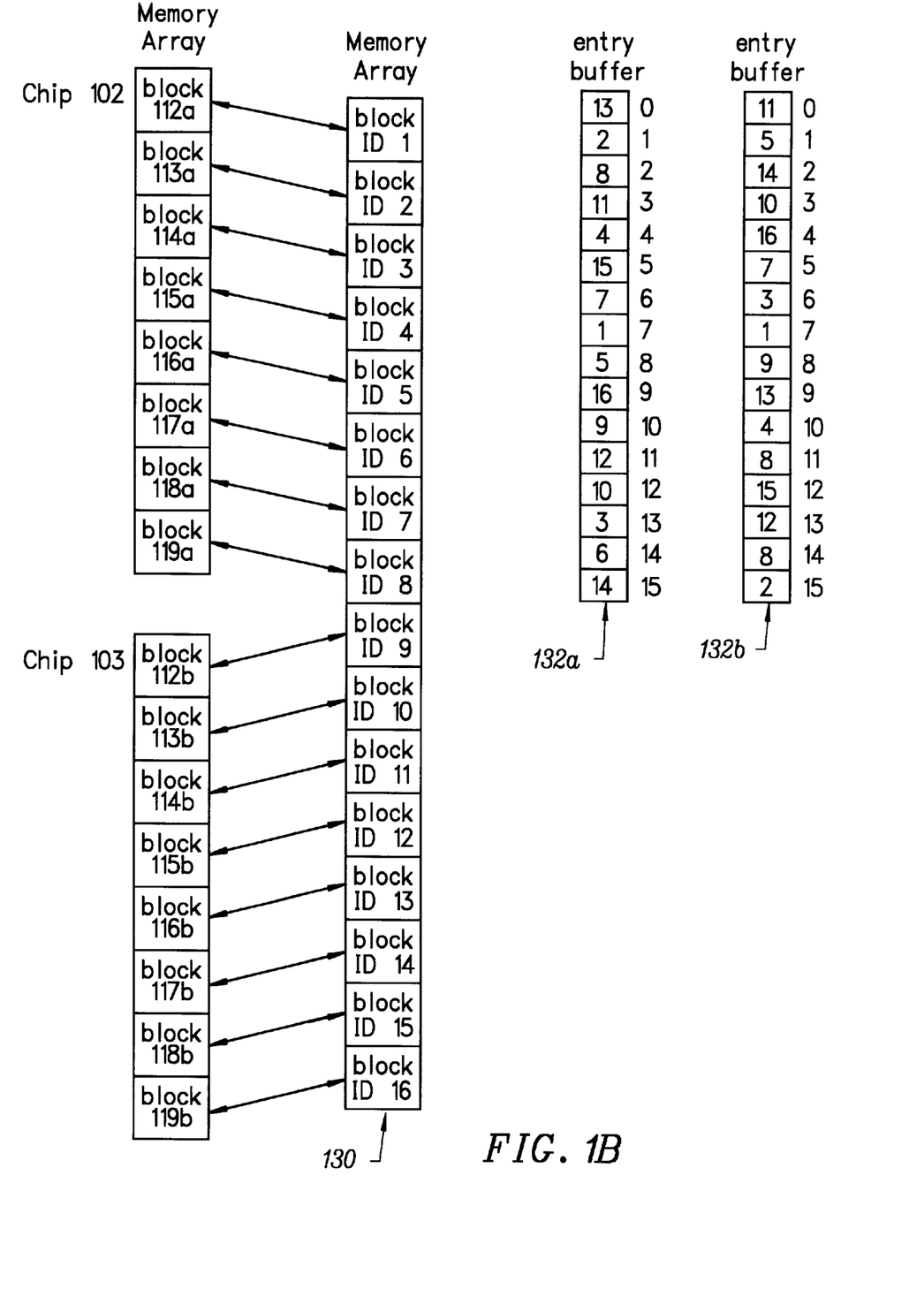
FIGS. 1B–1D show the logical structure of the flash memory system of the present invention.

The following is an example that shows one organization. It should be noted that the number of blocks used in this example is for illustrative purpose only, and an actual flash memory system could have many blocks. It is assumed that eight of the blocks in each chip are used in the array (the other blocks may be used for other purposes). Each memory block has a unique identification number (the "block ID"). In FIG. 1B, blocks 112a–119a of chip 102 and blocks 112b–119b of chip 103 are assigned, sequentially, block ID 1–16. These sixteen blocks now form a memory array 130. Because there is a one-to-one correspondence between a physical block and its block ID, the location of each block can be uniquely identified by specifying its block ID. In this sense, the block ID can be considered a form of block physical address. In one embodiment of the present invention, each block is further divided into sectors. In this embodiment, reading and writing of data is perform a sector at a time.

The block IDs can be arranged into various logical orders. In FIG. 1B, a buffer 132a is used to store the block IDs. This buffer is herein called an "entry buffer." Buffer 132a a contains a number of registers (sixteen in the present example because there are sixteen block IDs). In FIG. 1B, they are labeled from 0 to 15. Each register in the buffer is called an "entry". Each entry can be used to store an unique block ID.

As explained in more detail below, one aspect of the present invention is that the physical blocks in the present invention can undergo various logical transformations. Thus, the same physical block may contain data related to a first logical address at one time and a second logical address at another time. Buffer 132a can be used to implement a linear addressing scheme by associating the physical blocks with logical addresses. In FIG. 1B, each register in buffer 132a is associated with a range of logical addresses. The registers are arranged sequentially in a logical manner (e.g., from "0" to "15") so that there is a one-to-one relationship between the logical position of the registers and the logical address of data. Each register contains a block ID of the physical blocks used to store data having the associated addresses. For example, the first three registers in buffer 132a contain block ID 13, 2 and 8. As the blocks go through transformations, different physical blocks will be used to store data in the same address range. For example, FIG. 1B shows another arrangement, shown as entry buffer 132b, in which the first three registers contain block ID 11, 5 and 14. Note that in this example, buffers 132a and 132b are used to illustrate the different values stored in the same physically buffer.

Figure 1C:
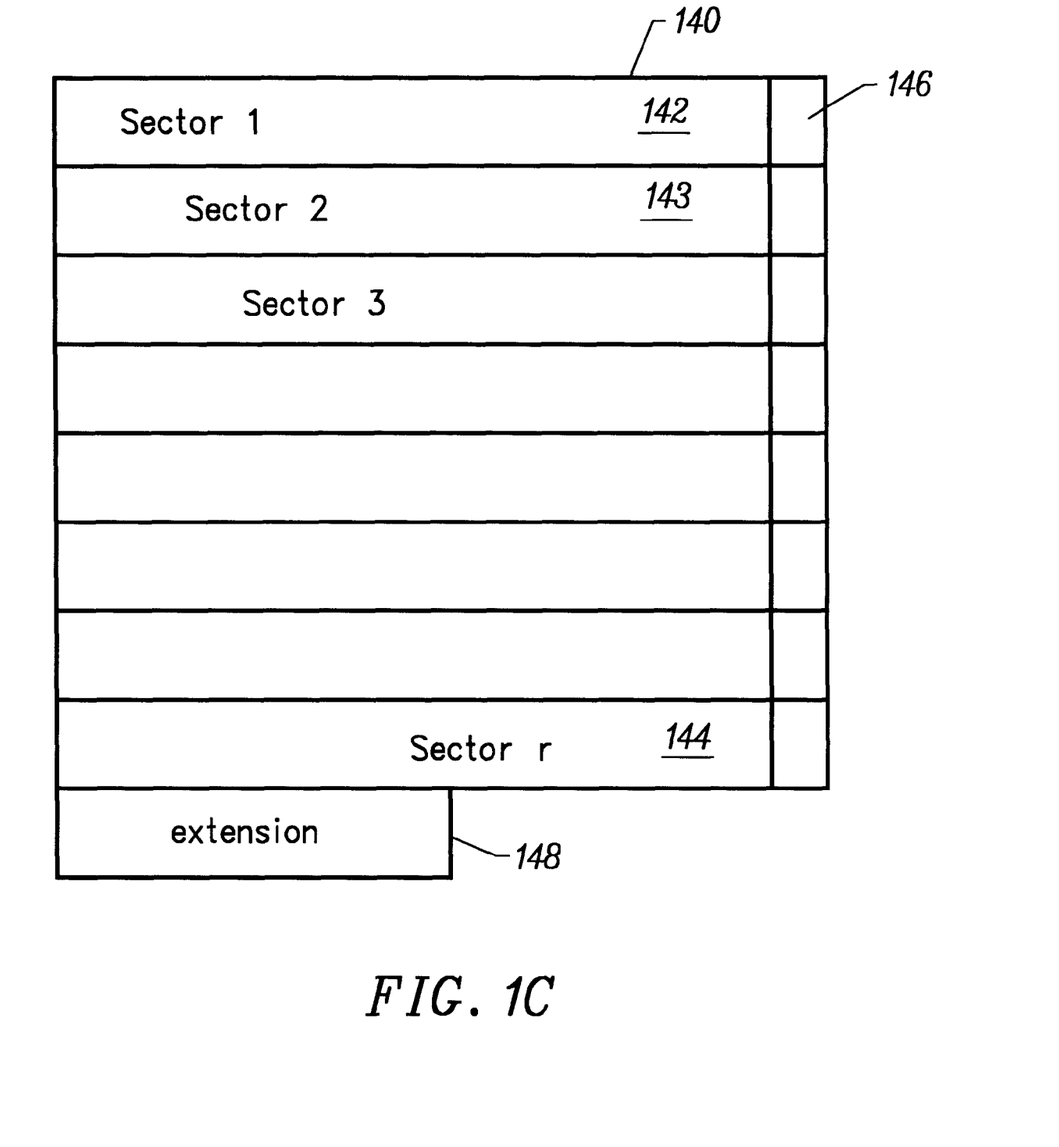

The flash memory system of the present invention can be used as mass storage in a large variety of information processing systems. As an example to show the operation of the present invention, flash memory system 100 is used to emulate a hard disk. FIG. 1C shows a block 140 in flash memory system 100. Block 140 is divided into r sectors, such as sectors 142–144. Block 140 also contains a memory region 148 (labeled as "extension") for storing attribute information related to block 140. Each sector also contains a sector attribute region (such as region 146 of sector 142) for storing attribute information of the sector.

(B) Mapping Logical Memory Address into Physical Flash Memory Address

As pointed out above, an essential function of a flash memory system is to store data and program. Typically, data and program are organized in a sector-based addressing scheme so that each piece of data can be uniquely identified. The flash memory system of the present invention can be designed to be compatible with this addressing scheme so that an external system can access flash mass storage by specifying the logical sector address.

Figure 1D:
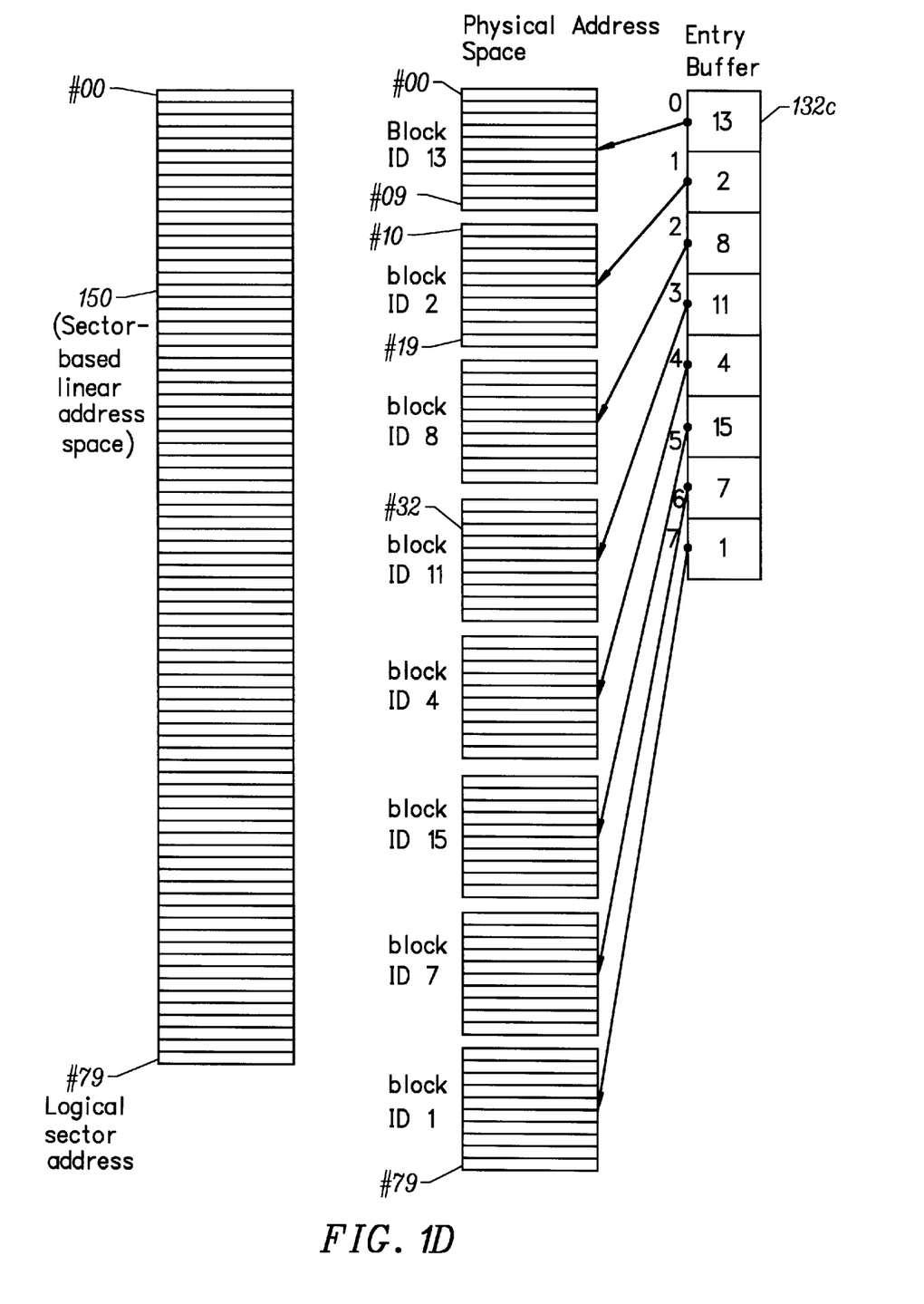

FIG. 1D shows an example that uses the flash memory system 100 of the present invention to implement typical memory organization. Many software systems (such as Microsoft's DOS operation system and Windows) use a sector-based linear addressing scheme to locate data in the mass storage. In this addressing scheme, memory address in a logical memory 150 increases linearly. The smallest addressable unit of memory space is a sector (which corresponds to the sectors 142–144 of FIG. 1C), i.e., data is read and written a sector at a time instead of a byte or a word at a time. The size of a sector can be chosen in accordance with the design of a file system. In the example shown in FIG. 1D, the starting sector address is shown as "00" and the highest sector address is shown (for illustrative purposes only) as "79". These logical sectors are grouped into logical blocks, and these logical blocks are mapped (using entry buffer 132c) into their corresponding physical blocks. The order of sectors in a physical block is retained as its corresponding logical block.

As an example, every block in FIG. 1D is assumed to contain ten sectors. In this example, numbers are in decimal form (instead of binary or hex representation). According to register number "0" of entry buffer 132c, a block having a block ID of 13 is assigned to be the first block of the logical address space. Thus, the sectors in this block correspond to logical sector address of "00" to "09". According to register number "1" of entry buffer 132c, a block having a block ID of 2 is assigned to be the second block. Thus, the sectors in this block correspond to logical sector address of "10" to "19." The same relationship holds for the other registers.

In order to use the inventive flash memory system to store data, controller 110 must be able to access data originated from an external system into uniquely identifiable sectors in the flash memory system. The above described logical sector address provides the interface between the external system and the flash memory system. The external system can indicate the position of the data to be accessed by specifying its logical sector address. When a logical sector address is known, the logical sector address can be calculated by dividing the number of total sectors within one block into the logical sector address. The quotient of this division is the logical block address and the remainder is the sector number within that logical block. The physical block address can be found by looking up a logical-physical block map table.

The following example illustrates how to obtain the physical location of a sector if its logical sector address is know. Assuming that a logical sector address #32 is given (see FIG. 1D), this address is divided by the number of sectors within one block (which is ten in this example). The quotient of the division is 3 and the remainder is 2. Therefore, the logical block address is 3, which is the quotient of the above division. This translates into physical block ID of 11, as can be obtained from the content of the entry buffer indexed 3. The remainder 2 of the above division is the sector order relative to the above obtained physical block ID. Because sector number starts with 0, the sector with logical sector address #32 is located at the third sector of the block with physical block ID of 11.

The entry buffers shown in FIG. 1B–1D is preferably implemented in RAM (static or dynamic). This is because information in the entry buffer needs to be changed frequently, and it may reduce efficiency if the entry buffer is implemented in a flash memory.

It is known that data stored in RAM will be erased after a computer system is powered down. Consequently, the information in an entry buffer will be lost when powered down. However, it is possible to reconstruct the content of the entry buffer by using the attribute information stored in the extension region of each block.

(C) Reading and Writing Data into the Memory System

The system of the present invention is used to store information. Consequently, it is necessary to write to and read from the blocks and sectors of the present invention. As mentioned above, a flash memory cannot be overwritten prior to erasure. Thus, it is necessary to introduce new structures, in additional to the blocks used for storing data.

In one embodiment of the present invention, the blocks are divided into a working (W) block, a temporary Q buffer, and an erasable (E) queue. The W buffer is used to store data. The Q buffer is used as a temporarily write buffer to a selected W block. This is needed because W blocks cannot be updated directly. Blocks that should be erased are placed into the E queue. As explained below, the introduction of the E queue arises from the need for block recycling so that an almost infinite supply of Q buffers can be generated from a fixed number of physical blocks. The preferred size of the E queue is determined by user applications.

This method of writing uses the Q buffer to accept new data. The Q buffer is later transformed to replace a corresponding W block. This W block can be erased and then used for other purposes. A new block is then allocated to be a new buffer. The use of the above described entry buffer facilitates this transformation.

One consequent of this writing method is that blocks are capable of being recycled (i.e., a dirty block can be changed logically to other types of blocks). This is because the present architecture needs a continuous supply of Q buffers. If blocks are not recycled, there may come a time when all the blocks are used and no more blocks can be allocated as Q buffers. Thus, the architecture of the present invention provides for a method to recycle blocks so that erased blocks can eventually be used as a buffer.

In another embodiment of the present invention, another buffer (called the X buffer) is used to handle random updating of data. This type of writing is called non-sequential writing. If the X buffer is not used, new Q buffers need to be allocated frequently. Details of non-sequential writing (and other aspects of reading and writing data into the flash memory system) are described in a separate patent application entitled "Flash Memory Mass Storage System" (application Ser. No. 08/756,304, now U.S. Pat. No. 5,745,418) filed on the same date and by the same inventors of the present patent application. The disclosure of the "Flash Memory Mass Storage System" application is incorporated herein by reference.

(D) Block Recycling

As explained above, one of the characteristics of the flash memory system of the present invention is that blocks are divided into several categories, each designed to perform a specific function. The above example also shows that there is a need for a constant supply of Q blocks. Further, dirty blocks need to be discarded. Because the number of blocks in a flash memory system is finite, there is a need to turn these dirty blocks into Q blocks. In the present architecture, blocks can be transformed from one category into another. As a result, there is an apparent endless supply of Q blocks.

The transformation of physical blocks is now described. In the present invention, a memory block can be placed in one of the following categories: erasable-clean ("E/C"), bad ("B"), main working block ("W"), sequential buffer ("Q"), and non-sequential buffer ("X"). The X buffer is used for non-sequential write, which is different from the Q buffer used for the above described sequential write. The details of non-sequential write will be described in detail in a separate section.

One of the characteristics of flash memory is that blocks could become defective during operation. These blocks should be marked so that they will not be used again. Blocks in the B category are blocks that are defective. This category is included here so that a complete picture of the block transformation can be presented.

Figure 2:
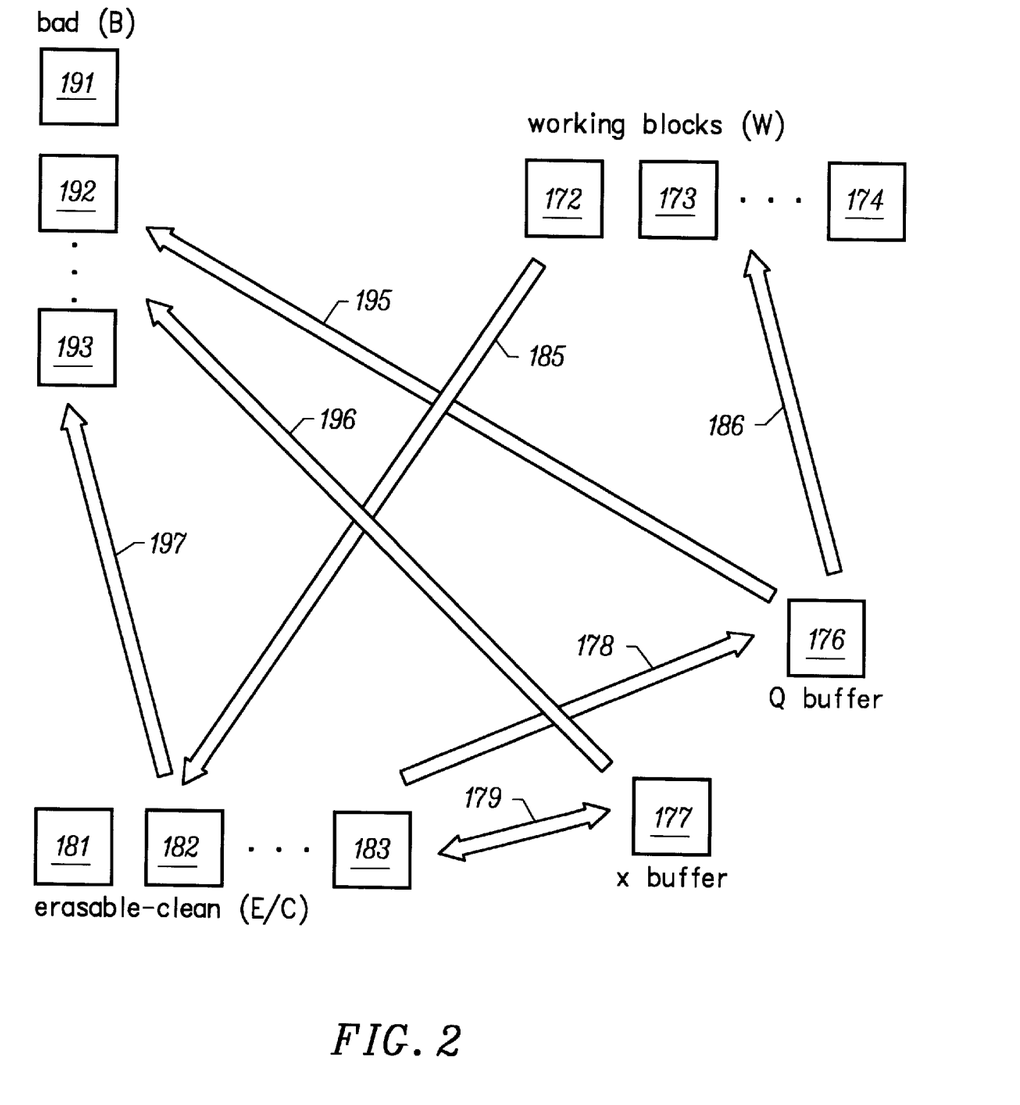
FIG. 2 is a schematic diagram showing the transformation of the blocks of the present invention from one category to another.

The relationship between these categories is shown in FIG. 2. In this architecture, the W blocks (e.g., blocks 172–174) are used to store data in a linear addressing scheme. Thus, each W block is associated with a certain address range in the scheme. In many situations, there are a large number of W blocks. Data cannot be written directly into the W blocks. Writing of new data can be directed to either a Q buffer 176 or an X buffer 177. In this embodiment, the Q buffer is used for sequential writing of new data and the X buffer is used for non-sequential writing of new data. The Q and X buffers are obtained, when needed, from a pool of clean blocks (such as blocks 181–183) in the E/C category (shown by arrows 178 and 179). W blocks with old or invalid data can be marked dirty and then placed into the E/C category (shown by an arrow 185). Dirty blocks in the E/C category are erased to make clean blocks. At appropriate times (as described in detail below), a Q buffer can be changed into a W block (shown by an arrow 186) and an X buffer can be placed into the E/C category (shown by the bi-directional arrow 179). If some of the blocks are defective, they will be placed into the B category (e.g., blocks 191–193). This is shown by arrows 195–197 in FIG. 2.

Other aspects of block recycling in the present flash memory system are described in the above mentioned patent application entitled "Flash Memory Mass Storage System".

As discussed above in connection with FIG. 1C, each block has an extension region 148. This region stores attribute information that can be used to determine the category of a block. The detail of the attribute information will be described below.

(E) Managing Sectors and Blocks Using Their Attributes

What is described above is the architecture of the present flash memory system. It is able to handle storing data in accordance with a sector-based addressing scheme, updating data therein, and retrieving data therefrom. However, in order to improve the reliability of the system, the architecture should also include ways to handle problems involving defect management, wear leveling and data security.

As pointed out above in connection with FIG. 1C, each sector has a sector attribute region and each block has a extension region for storing attribute information for a sector and a block, respectively. This information is used for defect management, wear leveling and data security.

Table 1 shows the names of the attributes (e.g. ADDR1 and ADDR2) and their meanings stored in the extension region. Similarly, table 2 shows the names of the attributes (e.g. BLOCK_ADDR1 and BLOCK_ADD2) and their meanings stored in the sector attribute region. Table 3 shows how to use the extension region attributes to determine the category of each block. Similarly, table 4 shows how to use data of the sector attribute region to determine the status of each sector.

In table 1, both of the attribute "ADDR1" and "ADDR2" contain the logical block address to which a block is currently associated; the attribute "age count" is increased by 1 every time a block is erased; the value of the attribute "bad status" is zero when a block is good and non-zero when a block is defective; and the value of the attribute "full status" is zero when a block contains at least one unused sector and non-zero when all of the sectors of the block are used. In table 2, both of the attribute "BLOCK_ADDR1" and "BLOCK_ADDR2" contain the logical block address to which a sector is associated when these attributes are related to a X buffer. If the attributes BLOCK_ADDR1 and BLOCK_ADDR2 are used in a Q buffer or a W block, they are not associated to a logical block address but used to identify whether this sector is valid or dirty. SECTOR_NO1 and SECTOR_NO2 of sector region are used by the sectors in a X buffer but not used by the sectors in a Q buffer of a W block. Both SECTOR_NO1 and SECTOR_NO2 are used by a sector in a X buffer to identify the sector number within the block to which the sector is associated. The attribute ECC contains error checking and correction code of the sector data.

TABLE 1

Data Structure of the Block Extension Region

| Name | Description |
| --- | --- |
| ADDR 1 | Logical block address |
| ADDR 2 | Logical block address (duplicate of ADDR1) |
| Age count | erase count |
| Bad Status | 0 to indicate a bad block, other value to indicate a good block |
| Full Status | 0 if at least one sector is not used; 1 if all sectors are used |

TABLE 2

Data Structure of the Sector Attribute Region

| Name | Description |
| --- | --- |
| BLOCK_ADDR1 | Logical block address for X buffer; Dirty flag for Q buffer and W block |
| BLOCK_ADDR2 | duplicate of BLOCK_ADDR1 |
| SECTOR_NO1 | sector number for X buffer; unused for Q buffer and W block |
| SECTOR_NO2 | duplicate of SECTOR_NO1 |
| ECC | Error checking and detection code. |

TABLE 3

Block Category Information Based on Block Extension Region

| Category | ADDR1 or ADDR2 | Full Status |
| --- | --- | --- |
| W | >=0 and < N | not 0 |
| Q | >=0 and < N | 0 |
| X | N | Don't care |
| E | >N | Don't care |

N = number of total blocks

Bad blocks are identified by a non-zero value of "Bad Status" field of Block Extension Region.

TABLE 4

Sector Status

| BLOCK_ADDR1 OR BLOCK_ADDR2 | Status |
| --- | --- |
| >=0 and < N | Used |
| >=N | Dirty |

N = number of total blocks

(F) Defect Management

As pointed out above, cells in a flash memory device could fail after a relatively small number of erase-write cycles. Thus, it is important to monitor defects in the memory system and deal with such failures as they occur. This is because a small number of defective cells could jeopardize the entire storage system.

Defects in flash memory can occur at two different time periods. The first time period is during manufacturing. The second time period is when the memory is in actual use. The defects that occur during this second time period are called "on-the-fly defects." The main purpose of defect management is to preserve the integrity of data.

(1) Managing Defects Arising from Manufacturing

In order to overcome the problem of defects arose during manufacturing, each block needs to be scanned prior to being introduced into the flash memory system. Blocks having bad bits are marked "bad," and will not be used to construct the flash memory system. In one embodiment of the present invention, a block is marked defective if a single bit is found to be defective. This scanning process can be performed using conventional defect detection methods. For example, a test pattern can be written into a block, and then read back to determine if the cells therein are defective. Alternatively, the following steps can be used:

(a) Perform block erasure. If erasure succeeds, go to the next step. Otherwise, mark this block as bad block. A bad block will never be used by the system.

(b) Program this block with all-zero pattern. If programming succeeds, go to the next step. Otherwise, mark this block as bad block.

(c) Perform block erasure again to ensure the block is in "clean state" (ready to be programmed). If the erasure succeeds, the block is considered good, and can be used in building the flash memory system. Otherwise, mark this block as bad block.

The system relies on the attribute information of flash device to determine if the program and erasure command are successful. After a program or erasure command is issued, the system will check the attribute information of flash device to make sure the command is successfully performed.

(2) On-The-Fly Defect Management

Figure 3:
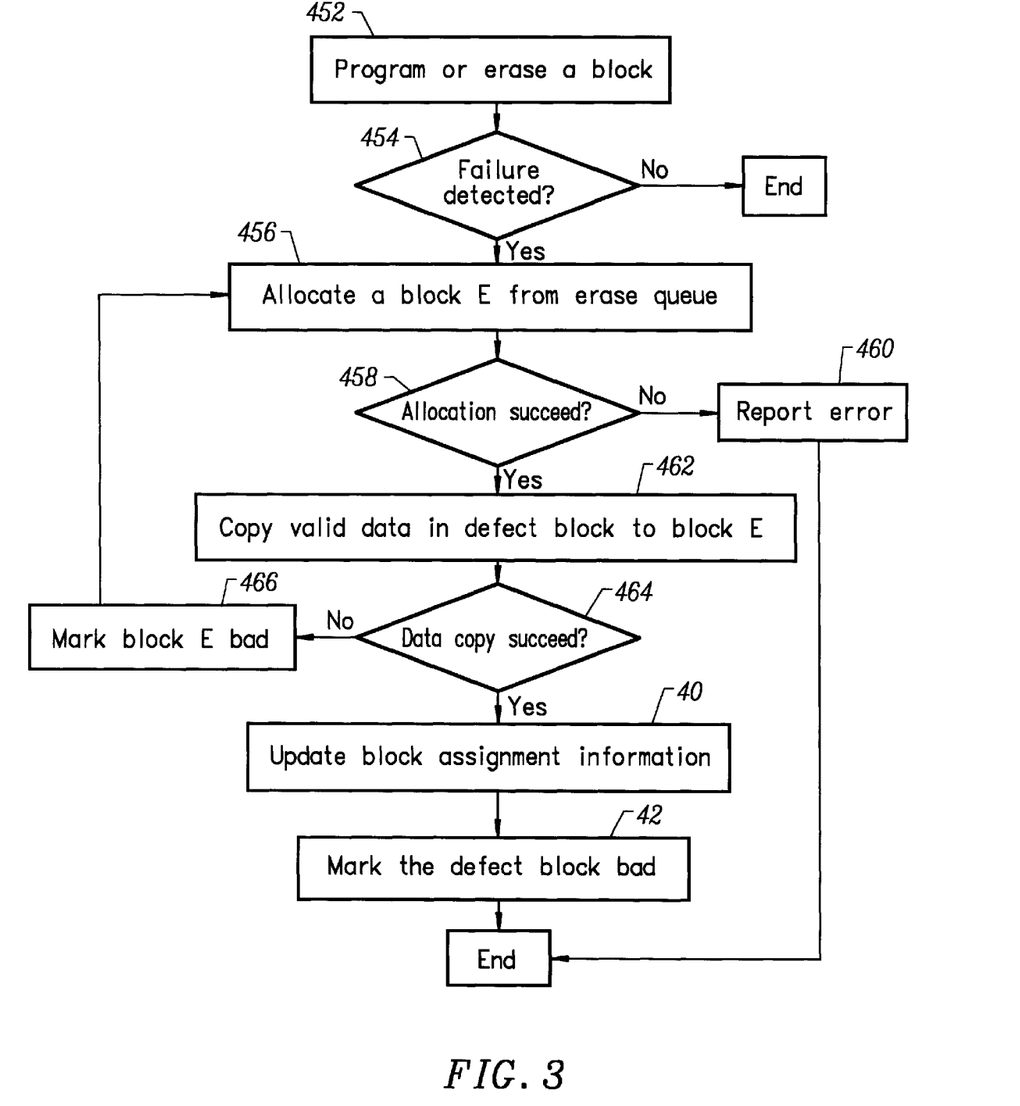
FIG. 3 is a flow chart of a defect management algorithm of the present invention.

The need for on-the-fly defect management arises from the observation that flash memory tends to have a limited life in use. This is believed to be due to the floating gate transistors of flash memory cells requiring longer to switch after undergoing some number of erase operations. For a typical flash memory cell, the switching time will be too long for data storage purposes after a few hundred thousand erase operations. Although this is a large number, some of the cells will undoubtedly fail during the useful life of the flash memory system. Methods to overcome the on-the-fly defects is now described (real-time defect management). Three types of operation error can be trapped and handled. They are read, program and erasure failure. Read failure may be caught and corrected by ECC (error checking and correction) method. If ECC cannot correct the error, the system will report a read failure. No defect management procedure will be invoked in this situation. The program and erasure failures are detected by checking the attribute information of the flash device. If the device reports an error, the defect management procedure will be started. When defect block is detected, the system will allocate a clean block from erase queue and copy all the valid data in the defect block to the clean block. The physical-logical block map table will be updated so that the new block replaces the defect block. The defect block will then be marked as a bad block. The flow chart of run-time defect management is shown in FIG. 3. In step 452, a program or erase operation takes place. In step 454, controller 110 determines if a failure is detected. If the answer is negative, the flow chart terminates. If the answer is positive, controller 110 allocates a block E from the E/C category (step 456). In step 458, controller 110 then determines whether the allocation is successful. If it is unsuccessful, an error is reported (step 460), and the flow chart terminates. If the allocation is successful, the valid data in the defective block is copied to the E block (step 462). Controller 110 then determines if the copying operation is successful (step 464). If the operation is not successful, the E block is marked bad (step 466). Another E block is allocated from the E/C category (step 456). If the copy operation is successful, the block map table is updated (step 470). The defective block is marked bad (step 472). The flow chart then terminates.

(G) Wear Leveling

Wear-leveling is a method for reducing the chance that any one block of flash memory from premature failing, thereby extending the life of the entire mass storage. This is because flash memory tends to have a limited life, as explained above.

In a typical computer operation, some portions of data or program (which can be translated into memory locations)

tend to be used less often than other portions. As a result, certain areas of a flash memory system (e.g., the areas where program codes are stored) are subject to very infrequent rewrite because programs are updated infrequently. On the other hand, blocks for storing data used by application programs are frequently updated. As a result, these blocks needs to be erased more often. Further, the blocks that are initially subject to frequent erasure have a high probability to be subject to additional erasure. As a result, these blocks tend to failure early. Consequently, it is desirable to equalize the amount of erasure for all the blocks.

One advantage of the present architecture is that it handles wear leveling naturally. As pointed out above, blocks are recycled. Thus, a particular physical block can hold data for a first linear address (e.g., "00") at one time and a second linear address (e.g., "55") at another time. Consequently, a block is not permanently tied to a fixed linear address. As a result, this arrangement tends to equalize the number of erase cycle of a block even if data in a certain linear address is changed less frequently than data in another linear address.

However, the above described system cannot be relied upon to handle all wear leveling problems. If a range of linear address is never or seldom changed, the blocks used to store the corresponding data will not be sufficiently recycled. In large software (e.g., Microsoft Windows), most of the program code does not need to be changed after installation. Thus, there are many megabytes of memory that are almost never changed. As a result, many blocks in the flash memory system will not be recycled. These blocks would have a very low age count.

To ensure all blocks have similar utilization, an "artificial" wear-leveling algorithm should be applied. Our objective is to maintain the difference of age counts of any two blocks (except bad blocks) within a predetermined value. The time to invoke wear-leveling procedure (described below in FIG. 4) is when a block is being pulled from the E/C category but before the transition to either X buffer or Q buffer. Whenever the wear-leveling procedure is invoked, the system will first scan the age count of all W blocks to find the block with the smallest age count (labeled herein as Wm). The block Wm with the smallest age count will be forced to join the block category rotation if the below criteria are satisfied:

(a) The age count of the block allocated from the E/C category (El) must be greater than the age count of Wm plus a predetermined value. The predetermined value is used to control the swapping frequency caused by wear-leveling procedure. The larger the predetermined value, the less block swapping will occur. Larger predetermined value implies more age difference can be tolerated between any two blocks.

(b) The block Wm must not be served by a Q buffer. If Wm is being served by a Q buffer, it will be sent to erase queue when a write request is outside the service range of a Q buffer (the details of such write request is discussed in the above described patent application entitled "Flash Memory Mass Storage System" under the name "Q block promotion"). Therefore, block swapping is not necessary here.

Figure 4:
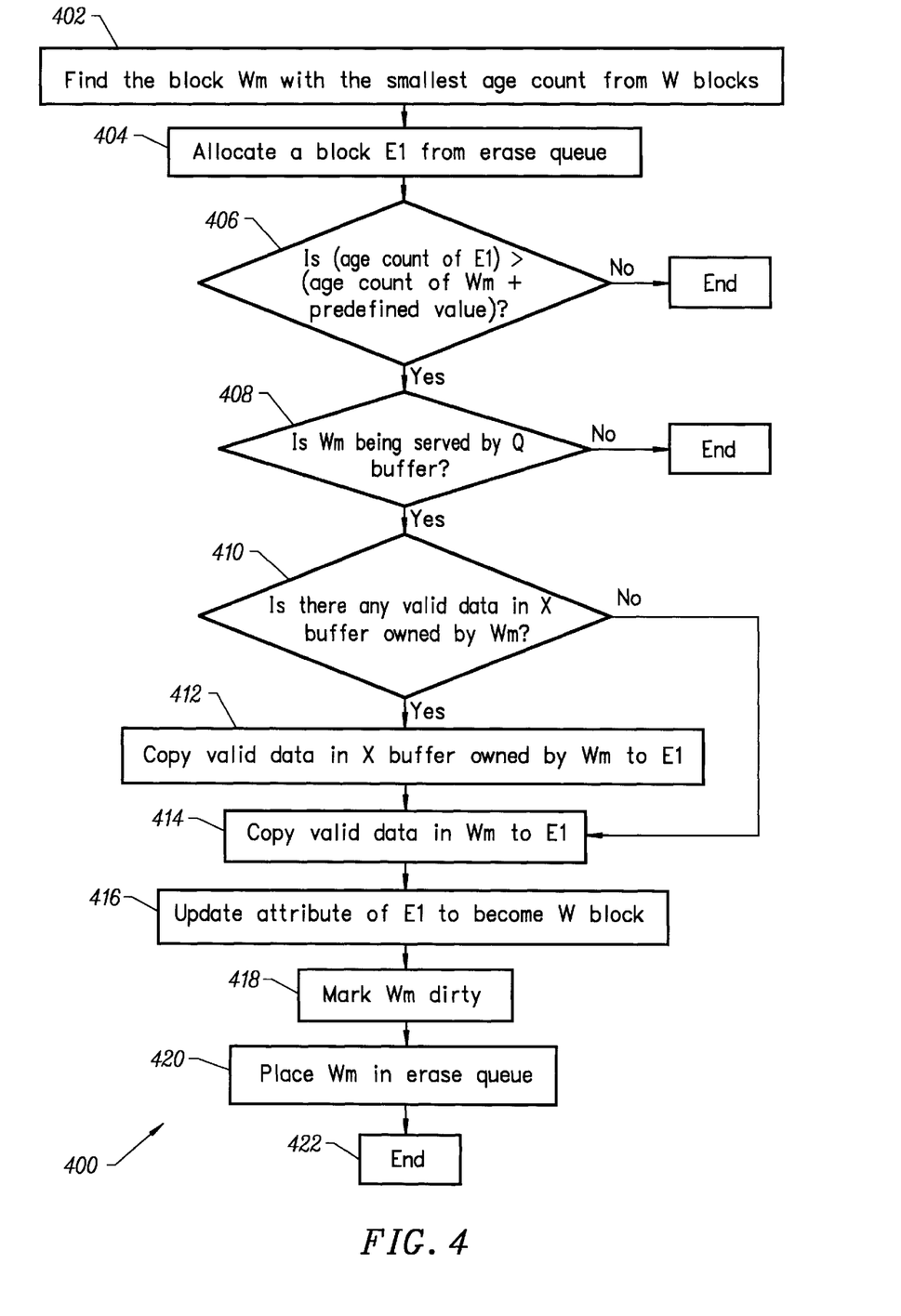
FIG. 4 is a flow chart of a wear leveling algorithm of the present invention.

A procedure 400 of wear leveling is shown in FIG. 4. In step 402, The block Wm having a smallest age count is pulled from the W blocks. In step 404, a block (labeled El in FIG. 4) is allocated from the E/C category. In step 406 controller 110 determines if the age of E1 is larger than the sum of the age of Wm and a predetermined value. If the answer is negative, procedure 400 stops. If the answer is positive, controller 110 determines if the Wm is served by a Q buffer (step 408). If the answer is negative, procedure 400 stops. If the answer is positive, controller 110 determines whether there are any valid data in the X buffer that belongs to Wm (step 410). If the answer is positive, the valid data in the X buffer that belongs to Wm is copied to block El (step 412). In step 414, the valid data in Wm is also copied to block El. If the answer to step 410 is negative, step 412 is not performed because there is no need to copy data from the X buffer.

After all the relevant data has been copied to block E1, the attribute of this block is changed to a W block (step 416). The original Wm block is marked dirty (step 418). The dirty Wm block is placed in the E/C category (step 420). Procedure 400 terminates.

(H) Data Security (1) Method to Ensure that Valid Data is Preserved

An important aspect of the present invention is that a sector is marked dirty only after a corresponding new sector has been written successfully. Thus, if there is any problem in writing the new sector, it is possible to go back to the existing sector to obtain the valid data.

Figure 5:
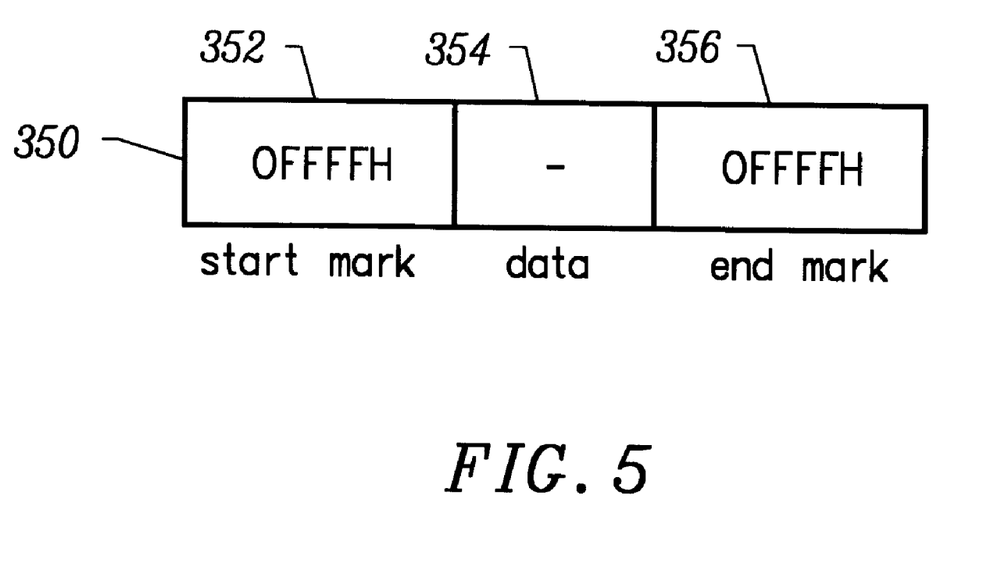
FIG. 5 shows the structure of a sector of the present invention.

FIG. 5 shows the structure of a sector 350 in accordance with one embodiment of the present invention. Sector 350 contains a start mark portion 352, a data portion 354 and an end mark portion 354. When the sector is clean (i.e., no data has been written thereto), both the start and end mark portions contain a pattern of, for example, "0FFFF" H. When it is ready to write data to sector 350, start mark portion 352 is written first. The content is changed from "0FFFF" to "00000". The data is then written into data portion 354. After data is successfully written into data portion 354, the content of end mark portion 356 is then changed to "00000". If the writing is unsuccessful, end mark portion 356 remains unchanged. Based on the content of the start and end mark portion, it is possible to identify three states of the sector (i.e., clean, half-valid, and valid) as follows:

(a) clean: start mark portion="0FFFF" and end mark portion "0FFFF";

(b) half valid: start mark portion="00000" and end mark portion="0FFFF"; and (c) valid: start mark portion="00000" and end mark portion "00000".

If problem occurs prior to the writing of a new sector, none of the portions are affected. The sector is in the first state (i.e., clean). Thus, this sector can be used again. If problem occurs when some of the data is written, start mark portion 352 would be changed to "00000". Some of the bits in data portion 354 have been written. However, end mark portion 352 remains unchanged. Thus, the sector is in the second state (i.e., half valid). When the problem condition is remove, this sector needs to be marked dirty because not all the data in data portion 354 is valid. The corresponding old sector (which has not yet been marked dirty) is deemed to be valid. If problem occurs after the sector is fully written, the end mark portion 356 would be changed to "00000". This sector is now in the third state (i.e., valid). When the problem is removed, the corresponding old sector needs to be marked dirty (if this step has not be carried out prior to the occurrence of the problem). In this way, only one sector is keep valid at a time.

(2) New Error Detection and Correction Method

As can be seen in Table 2, each sector contains a (ECC) of conventional error checking and correction. Another aspect of data integrity relates to a method to detect and correct errors that makes use of specific properties of flash memory. It is known that a common source of error in flash memory cells is for a "1" bit to change to a "0" bit. This error can result from column stress or bit line failure. One way to recover the correct data is to (1) store the bit in two separate cells and (2) later read these two bits and "or" them together. If one of the two bits becomes corrupted, the bit will change from a "1" to a "0". By or-ing a corrupted bit with a correct bit together, the correct bit can be determined.

It should be noted that if the common source of error were from a "0" bit to a "1" bit, step (2) above should be an "and" operation to recover the correct bit.

This error detection and correct method is used in tables 3 and 4. Table 3 contains a column "ADDR1 or ADDR2", which is the bitwise "or" of the attributes ADDR1 and ADDR2 of table 1. These two attributes contain the same value (if not corrupted). The "or" operation provides the required data security protection. Similarly, table 4 contains a column "SECTOR_NO1^SECTOR_NO2", which is the bitwise "or" of the attributes SECTOR_NO1 and SECTOR_NO2 of table 2. Again, these two attributes contain the same value (if not corrupted), and the "or" operation provides the required data security protection.

The invention has been described with reference to specific exemplary embodiments thereof. Various modification and changes may be made thereunto without departing from the broad spirit and scope of the invention. The specification and drawings are, accordingly, to be regarded in an illustrative rather than a restrictive sense; the invention is limited only by the provided claims.

We claim:

1. A method for managing a mass storage system implemented using flash memory, comprising the steps of:

(a) dividing said flash memory into a plurality of data blocks;

(b) indicating that specified data blocks belong to a first type of blocks, said first type designating blocks being used to store data organized in accordance with a pre-defined addressing scheme;

(c) indicating that specified data blocks belong to a second type of blocks, said second type designating blocks being used as image buffers of associated blocks of the first type for storing data, and as later replacements of the associated blocks of the first type;

(d) indicating that specified data blocks belong to a third type of blocks, said third type designating blocks containing data that will be erased;

(e) changing at least one of said plurality of blocks from one of said first, said second and said third types of blocks to another type; and (f) equalizing the number of erasures for a subset of said plurality of data blocks.

2. The method of claim 1 wherein said equalizing step comprises the steps of:

(a) determining an age count for said subset of blocks; and (b) equalizing said age count for said subset of blocks.

3. The method of claim 2 wherein said step of determining said age count comprises the steps of:

(a) assigning a region in each of said subset of blocks for storing said age count; and (b) increasing said age count each time when a block in said subset of blocks is erased.

4. A method for managing a mass storage system implemented using flash memory, comprising the steps of:

(a) dividing said flash memory into a plurality of data blocks;

(b) indicating that specified data blocks belong to a first type of blocks, said first type designating blocks being used to store data organized in accordance with a pre-defined addressing scheme;

(c) indicating that specified data blocks belong to a second type of blocks, said second type designating blocks being used as image buffers of associated blocks of the first type for storing data, and as later replacements of the associated blocks of the first type;

(d) indicating that specified data blocks belong to a third type of blocks, said third type designating blocks containing data that will be erased;

(e) changing at least one of said plurality of blocks from one of said first, said second and said third types of blocks to another type; and (f) preserving valid data in a subset of said plurality of blocks.

5. The method of claim 4 wherein said preserving step further comprises the step of marking a block in said first type of blocks dirty after valid data is written into a block in said second type of blocks.

6. The method of claim 4 wherein said preserving step further comprises the steps of:

(a) dividing a block in said subset into a plurality of sectors, each block having a start portion, a data portion, and an end portion; and (b) marking a sector in said block valid only when said start and said end portions contain valid data.

7. The method of claim 4 wherein said preserving step further comprises the steps of:

(a) dividing a block in said subset into a plurality of sectors, each block having a start portion, a data portion, and an end portion; and (b) marking a sector in said block clean only when no data has been written into said start and said end portions.

8. The method of claim 4 wherein said preserving step further comprises the steps of:

(a) storing a piece of data in two separate memory locations; and (b) forming an "OR" operation of data in said two separate memory locations to recover said piece of data.

9. The method of claim 4 wherein said preserving step further comprises the steps of:

(a) storing a piece of data in two separate memory locations; and (b) forming an "AND" operation of data in said two separate memory locations to recover said piece of data.

10. The method of claim 8 wherein said piece of data comprises information associated with the memory location and sector address.

11. The method of claim 9 wherein said piece of data comprises information associated with the memory location and sector address.

12. The method of claim 8 wherein said piece of data comprises information not protected by ECC.

13. The method of claim 9 wherein said piece of data comprises information not protected by ECC.

* * * * *